United States Patent
Wu et al.

(10) Patent No.: US 9,746,495 B2
(45) Date of Patent: Aug. 29, 2017

(54) PROBE DEVICE HAVING SPRING PROBE

(71) Applicant: MPI CORPORATION, Chu-Pei, Hsinchu Shien (TW)

(72) Inventors: Chien-Chou Wu, Chu-Pei (TW); Tsung-Yi Chen, Chu-Pei (TW)

(73) Assignee: MPI Corporation, Chu-Pei, Hsinchu Shien (TW)

( * ) Notice: Subject to any disclaimer, the term of this patent is extended or adjusted under 35 U.S.C. 154(b) by 0 days.

(21) Appl. No.: 14/628,622

(22) Filed: Feb. 23, 2015

(65) Prior Publication Data

US 2015/0276806 A1   Oct. 1, 2015

Related U.S. Application Data

(60) Provisional application No. 61/943,540, filed on Feb. 24, 2014.

(30) Foreign Application Priority Data

Jul. 9, 2014   (TW) .............................. 103123651 A

(51) Int. Cl.
*G01R 1/067* (2006.01)
*G01R 1/073* (2006.01)
*G01R 3/00* (2006.01)

(52) U.S. Cl.
CPC ..... *G01R 1/06722* (2013.01); *G01R 1/06705* (2013.01); *G01R 1/07342* (2013.01); *G01R 3/00* (2013.01)

(58) Field of Classification Search
CPC ................................................. G01R 1/06722
See application file for complete search history.

(56) References Cited

U.S. PATENT DOCUMENTS

| 2013/0009658 A1* | 1/2013 | Nishikawa ......... G01R 1/06722 324/755.05 |
| 2013/0057308 A1* | 3/2013 | Yano ........................ G01R 3/00 324/755.01 |

FOREIGN PATENT DOCUMENTS

JP   2013-007750 A   1/2013

* cited by examiner

*Primary Examiner* — Clayton E Laballe
*Assistant Examiner* — Noam Reisner
(74) *Attorney, Agent, or Firm* — Muncy, Geissler, Olds & Lowe, P.C.

(57) ABSTRACT

A probe device includes a spring probe and a probe seat. The spring probe includes a needle and a spring sleeve sleeved onto the needle and provided with at least one spring section and at least one non-spring section. The probe seat includes a plurality of dies stacked together and at least one guiding hole through which the spring probe is inserted. An upper edge and a lower edge of the guiding hole of the probe seat are arranged corresponding in position to the non-spring section of the spring sleeve. As a result, the spring probe is prevented from getting jammed due to the contact of the spring section of the spring sleeve with the upper and lower edges of the guiding hole.

12 Claims, 16 Drawing Sheets

PROBE DEVICE HAVING SPRING PROBE

BACKGROUND OF THE INVENTION

1. Field of the Invention

The present invention relates generally to probe devices and more particularly, to a probe device having a spring probe.

2. Description of the Related Art

Upon testing semiconductor chips, a tester is electrically connected with devices under test (hereinafter referred to as the "DUTs") through a probe card, so that the tester can obtain the testing results of the DUTs by means of signal transmission and analysis. The conventional probe card is usually composed of a circuit board and a probe device, or further comprises a space transformer disposed between the circuit board and the probe device. The probe device has a plurality of probes arranged corresponding to contact pads of the DUTs, so that the contact pads can be probed by the probes at the same time.

FIG. 1 is an exploded plan view of a conventional spring probe 11 which comprises a needle 12, and a spring sleeve 13 sleeved onto the needle 12. FIG. 2 is a schematic sectional view of a probe card 14 using the spring probe 11. For the convenience of illustration, FIG. 2 is not drawn to the same scale with FIG. 1. The probe card 14 comprises a circuit board 15 and a probe device 16 having a probe seat 17 and a plurality of probes 11. For the convenience of illustration, only a small part of the circuit board 15 and the probe seat 17 and one of the probes 11 are shown in FIG. 2.

The needle 12 and the spring sleeve 13 of the probe 11 are connected in a way that a connection segment 132, which is provided near the bottom end of the spring sleeve 13, is pressed against the needle 12 and fixed to the needle 12 by welding, such as spot welding. As a result, the connection segment 132 has two convex portions 134 resulted from deformation of the connection segment 132 in the aforesaid press fixing process, and the convex portions 134 protrude over an outer cylinder surface 136 of non-pressed parts of the spring sleeve 13.

The probe seat 17 is composed of upper, middle and lower dies 171, 172, 173; however, the probe seat 17 may be provided without such middle die 172 but composed of the upper and lower dies 171, 173 only. The probe seat 17 has a plurality of installing holes 174 provided in the assembly of the dies 171, 172, 173 (only one of the installing holes 174 is shown in FIG. 2). In order that the spring probe 11 can be installed into the installing hole 174 through a top surface 175 of the completely assembled probe seat 17 and rotatable unlimitedly in the installing hole 174 when probing a DUT, the installing hole 174 is configured as a circular hole with a radius greater than the maximum distance between each convex portion 134 and the center of the spring probe 11.

After the probe device 16 is assembled completely, the circuit board 15 is disposed on the top surface 175 of the probe seat 17. The top end of the spring sleeve 13 is electrically connected with a contact pad of the circuit board 15. The bottom end of the needle 12 is adapted to probe a contact pad of the DUT. Specifically speaking, the top end of the spring sleeve 13 is abutted against the circuit board 15, and the spring sleeve 13 is provided with two spring sections 138 which are compressible elastically; besides, the connection segment 132 of the spring sleeve 13 is fixed to the bottom section of the needle 12, and a clearance 18 is provided between the top end of the needle 12 and the circuit board 15, i.e. between the top end of the needle 12 and the top end of the spring sleeve 13. Therefore, when the bottom end of the needle 12 contacts the contact pad of the DUT and correspondingly feeds forward, the needle 12 will retract backwards, such that the spring sleeve 13 will be compressed. In this way, the probe 11 can positively contact and electrically connect the contact pad of the DUT; besides, by means of the cushioning effect provided by the spring sleeve 13, an exceeding contact force, which may cause damage or heavy wear of the contact pad of the DUT or the needle, can be prevented.

The outer radius of the aforesaid spring probe 11 is very small, which is usually in a range of several tens micrometer to a little more than one hundred micrometer, and the aspect ratio of the spring probe 11, i.e. a ratio of height to width thereof, is very large, which is usually in a range of 10:1 to 100:1. Besides, except for the convex portions 134 which are relatively closer to the inner wall of the installing hole 174, the other parts of the spring sleeve 13 are quite distanced from the inner wall of the installing hole 174. Therefore, the spring probe 11 is liable to deflect and bend when the bottom end of the needle 12 receives external force, as shown in FIG. 3. This phenomenon may result in problems of inaccurate alignment, unstable probing pressure, and the tendency of fracture of the probe. If the probe is fractured, more problems will be caused, such as difficulties in maintaining and replacing the probe.

On the other hand, a juncture 176 of the upper and middle dies 171, 172 is arranged corresponding in position to one of the spring sections 138 of the spring sleeve 13, and a juncture 177 of the middle and lower dies 172, 173 is arranged corresponding in position to the other spring section 138 of the spring sleeve 13. If the dies 171, 172, 173 are not well aligned with each other due to assembly error to cause unevenness on the inner wall of the installing hole 174 at the junctures 176, 177, the spring sections 138 are liable to contact the uneven junctures 176, 177 and then jam at the uneven junctures 176, 177. In this case, the spring probe 11 will need maintenance and have subsequent problems, such as difficulties and time-consumption in maintenance.

SUMMARY OF THE INVENTION

The present invention has been accomplished in view of the above-noted circumstances. It is an objective of the present invention to provide a probe device having a spring probe, wherein the spring probe is prevented from exceeding deflection and bending.

To attain the above objective, the present invention provides a probe device which comprises a spring probe and a probe seat. The spring probe comprises a needle, and a spring sleeve sleeved onto the needle and having at least one spring section and a connection segment fixed to the needle and provided with a convex portion protruding over an outer cylinder surface of the at least one spring section. The probe seat comprises a plurality of dies stacked together, and at least one guiding hole through which the spring probe is inserted. The dies of the probe seat comprise a lower die and an upper die. The at least one guiding hole of the probe seat comprises an upper guiding hole provided in the upper die with a non-circle profile and defined with a center, a guiding surface and a supporting surface. A distance between the supporting surface and the center is greater than a radius of the outer cylinder surface of the spring section of the spring sleeve. A distance between the guiding surface and the center is greater than the distance between the supporting surface and the center and greater than a maximum distance between the convex portion and a center of the needle.

As a result, the upper guiding hole enables the connection segment of the spring sleeve to pass therethrough in a way that the convex portion faces the guiding surface. Besides, the supporting surface can be provided so close to the outer cylinder surface of the spring sleeve as to limit the position of the spring sleeve, so that the spring probe is prevented from exceeding deflection and bending.

It is another objective of the present invention to provide a probe device having a spring probe, which can prevent the spring sleeve of the spring probe from getting jammed.

To attain the above objective, the present invention provides a probe device which comprises a spring probe and a probe seat. The spring probe comprises a needle, and a spring sleeve sleeved onto the needle and provided with at least one spring section and at least one non-spring section. The probe seat comprises a plurality of dies stacked together, and at least one guiding hole through which the spring probe is inserted. An upper edge and a lower edge of the guiding hole of the probe seat are arranged corresponding in position to the non-spring section of the spring sleeve. As a result, the spring section of the spring sleeve is prevented from contacting the upper and lower edges of the guiding hole, so that the spring sleeve is prevented from getting jammed.

Preferably, a juncture of every two dies connected with each other may be arranged corresponding in position to the non-spring section of the spring sleeve. In this way, even the assembly error causes unevenness of the juncture of the dies, the spring section of the spring probe is less possible to contact the uneven juncture of the dies, thereby preventing the spring section of the spring probe from getting jammed.

Preferably, the guiding hole of the probe seat may be arranged corresponding in position to the non-spring section of the spring sleeve completely. In this way, the spring section is prevented from contacting the upper and lower edges of the guiding hole, thereby preventing the spring section from getting jammed.

Preferably, the spring section of the spring sleeve may be arranged corresponding in position to the guiding hole of the probe seat completely. In this way, the spring section is prevented from contacting the uneven juncture of the dies or the upper and lower edges of the guiding hole, thereby preventing the spring section from getting jammed.

Preferably, the spring sleeve may have a plurality of spring sections, and at least one of the spring sections is arranged corresponding in position to the guiding hole of the probe seat completely. Alternately, the probe seat may have a plurality of the guiding holes, and at least one of the guiding holes is arranged corresponding in position to the non-spring section of the spring sleeve completely. This means the former of the aforesaid two features may be provided at parts of the spring sleeve and the probe seat, and the latter of the aforesaid two features is provided at the other parts of the spring sleeve and the probe seat, so that the spring sleeve is relatively lesser possible to get jammed.

Preferably, the probe seat may have at least one space communicating with the guiding hole of the probe seat and corresponding in position to the spring section of the spring sleeve. Alternately, the probe seat may have at least one space communicating with the guiding hole of the probe seat and corresponding in position to the non-spring section of the spring sleeve. In this way, the dies of the probe seat are relatively easier in manufacturing.

In an embodiment of the present invention, the dies of the probe seat comprise a lower die and an upper die. A juncture of the lower die and the upper die is arranged corresponding in position to a non-spring section. The at least one guiding hole of the probe seat comprises an upper guiding hole provided in the upper die. The at least one spring section of the spring sleeve comprises an upper spring section corresponding in position to the upper guiding hole completely.

Alternately, the dies of the probe seat may comprise an upper die, a lower die, and a middle die disposed between the upper die and the lower die. A juncture of the upper die and the middle die is arranged corresponding in position to a non-spring section. A juncture of the middle die and the lower die is arranged corresponding in position to another non-spring section. The at least one guiding hole of the probe seat comprises an upper guiding hole provided in the upper die, and a middle guiding hole provided in the middle die. The at least one spring section of the spring sleeve comprises an upper spring section corresponding in position to the upper guiding hole completely, and a middle spring section corresponding in position to the middle guiding hole completely. Preferably, the probe seat may have a space located between the upper guiding hole and the middle guiding hole and corresponding in position to the non-spring section, so that the dies of the probe seat are relatively easier in manufacturing.

Besides, the at least one guiding hole of the probe seat may further comprise a lower guiding hole provided in the lower die, and the at least one spring section of the spring sleeve further comprises a lower spring section corresponding in position to the lower guiding hole completely. In this way, the spring sleeve has very good elasticity; besides, the spring sections are completely located in the guiding holes respectively so as to be prevented from contacting the junctures of the dies or upper and lower edges of the guiding holes, so that the spring sections are less possible to get jammed. Preferably, the probe seat may have a space located between the middle guiding hole and the lower guiding hole and corresponding in position to a non-spring section, so that the dies of the probe seat are relatively easier in manufacturing.

Preferably, the spring sleeve has a connection segment fixed to the needle and provided with a convex portion protruding over an outer cylinder surface of the at least one spring section. The lower die has a space in which the connection segment is located. In this way, if the spring probe rotates when receiving external force, the convex portion of the spring sleeve is less possible to be abutted against the lower die. Alternately, the convex portion may be located in the lower guiding hole.

In another embodiment of the present invention, the dies of the probe seat comprise a lower die and an upper die. The at least one guiding hole of the probe seat comprises an upper guiding hole provided in the upper die. The at least one non-spring section of the spring sleeve comprises an upper non-spring section, and a lower non-spring section fixed to the needle. The at least one spring section is located between the upper non-spring section and the lower non-spring section. The upper guiding hole is arranged corresponding in position to the upper non-spring section completely. Preferably, the lower die has a space in which the lower non-spring section is located.

Besides, the dies of the probe seat may further comprise a middle die disposed between the upper die and the lower die. The at least one non-spring section of the spring sleeve may further comprise a middle non-spring section located between the upper non-spring section and the lower non-spring section. The at least one guiding hole of the probe seat may further comprise a middle guiding hole provided in the middle die and corresponding in position to the middle non-spring section completely. The probe seat has a space located between the upper guiding hole and the middle guiding hole and corresponding in position to a spring section. Preferably, the lower die may have a space in which the lower non-spring section is located, and the middle die may have a space communicating with the space of the lower die and corresponding in position to another spring section.

In still another embodiment of the present invention, a juncture of every two said dies connected with each other is arranged corresponding in position to the spring section of the spring sleeve, and the at least one guiding hole of the probe seat is arranged corresponding in position to the at least one non-spring section of the spring sleeve completely. In this way, the spring section of the spring sleeve is prevented from contacting the upper and lower edges of the guiding hole of the probe seat, thereby preventing the spring section from getting jammed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
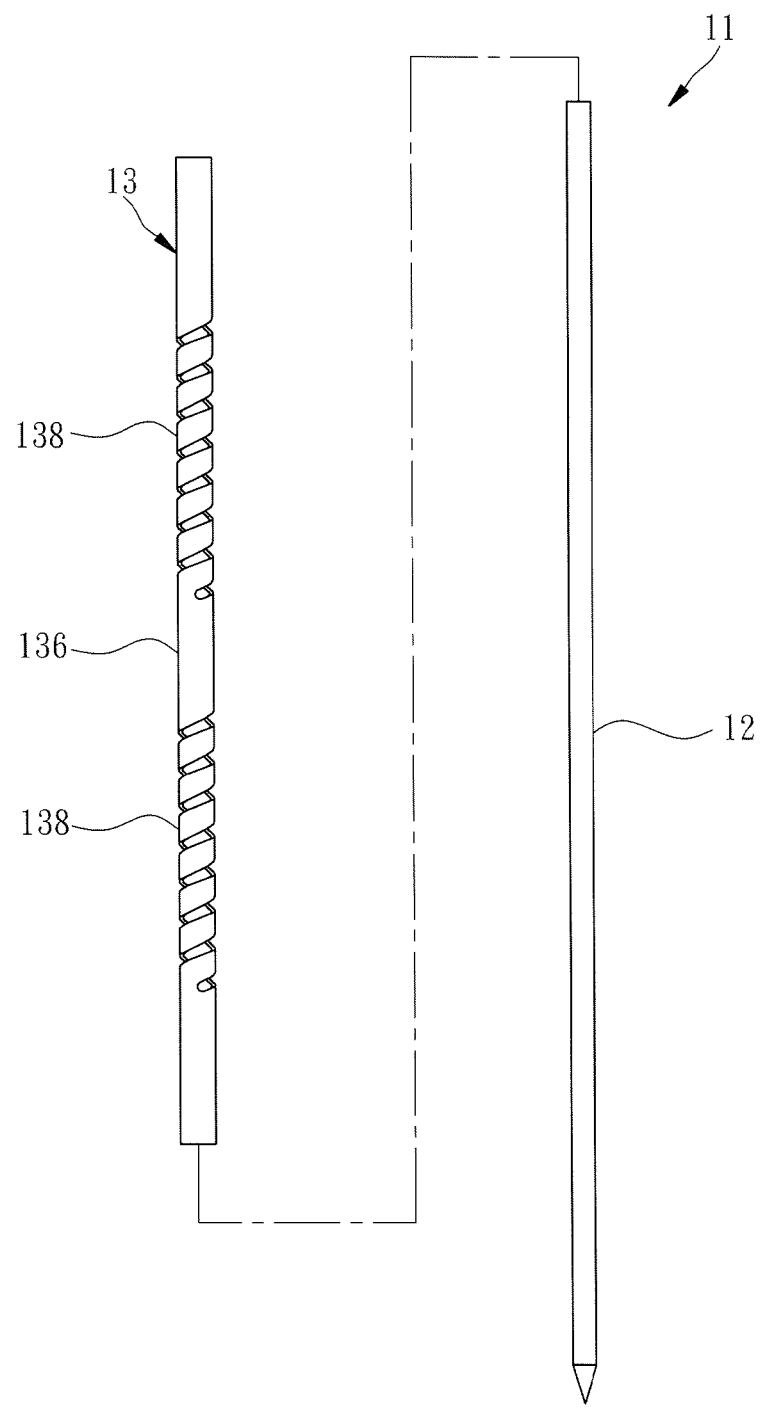
FIG. 1 is an exploded plan view of a conventional spring probe.

First of all, it is to be mentioned that same reference numerals used in the following preferred embodiments and the appendix drawings designate same or similar elements throughout the specification for the purpose of concise illustration of the present invention. Besides, when it is mentioned that an element is located above another element, it means that the former element is directly disposed on the latter element, or the former element is indirectly disposed on the latter element through one or more other elements between aforesaid former and latter elements. On the other hand, the drawings of the following embodiments are provided only for the convenience of illustrating the technical features of the present invention, and therefore not drawn to the real scale.

Referring to FIGS. 4-7, a probe device 20 according to a first preferred embodiment of the present invention comprises a spring probe 30 and a probe seat 40. The amount of the spring probe 30 is unlimited. In practice, the probe device 20 may comprise many spring probes 30. For the convenience of illustration, only a small part of the probe seat 40 and one of the spring probes 30 are shown in the drawings of this embodiment and the following embodiments.

The spring probe 30 comprises an electricity-conductive needle 32 shaped as a solid straight cylinder, and an electricity-conductive spring sleeve 34 sleeved onto the needle 32. A circular metal pipe with uniform diameter is processed by photolithography technique to from the spring sleeve 34. Therefore, when the spring sleeve 34 is not yet fixed to the needle 32, the whole spring sleeve 34 is approximately shaped as a straight circular pipe with uniform diameter, but has two spring sections 342 helically opened through an outer cylinder surface 341 thereof, and three non-spring sections 344 not opened helically. Each of the spring sections 342 is located between two non-spring sections 344. The non-spring section 344 nearest to the bottom end of the spring sleeve 34 is provided with a connection segment 346. After the spring sleeve 34 is sleeved onto the needle 32, the connection segment 346 is pressed against the needle 32 and fixed to the needle 32 by welding.

Figure 2:
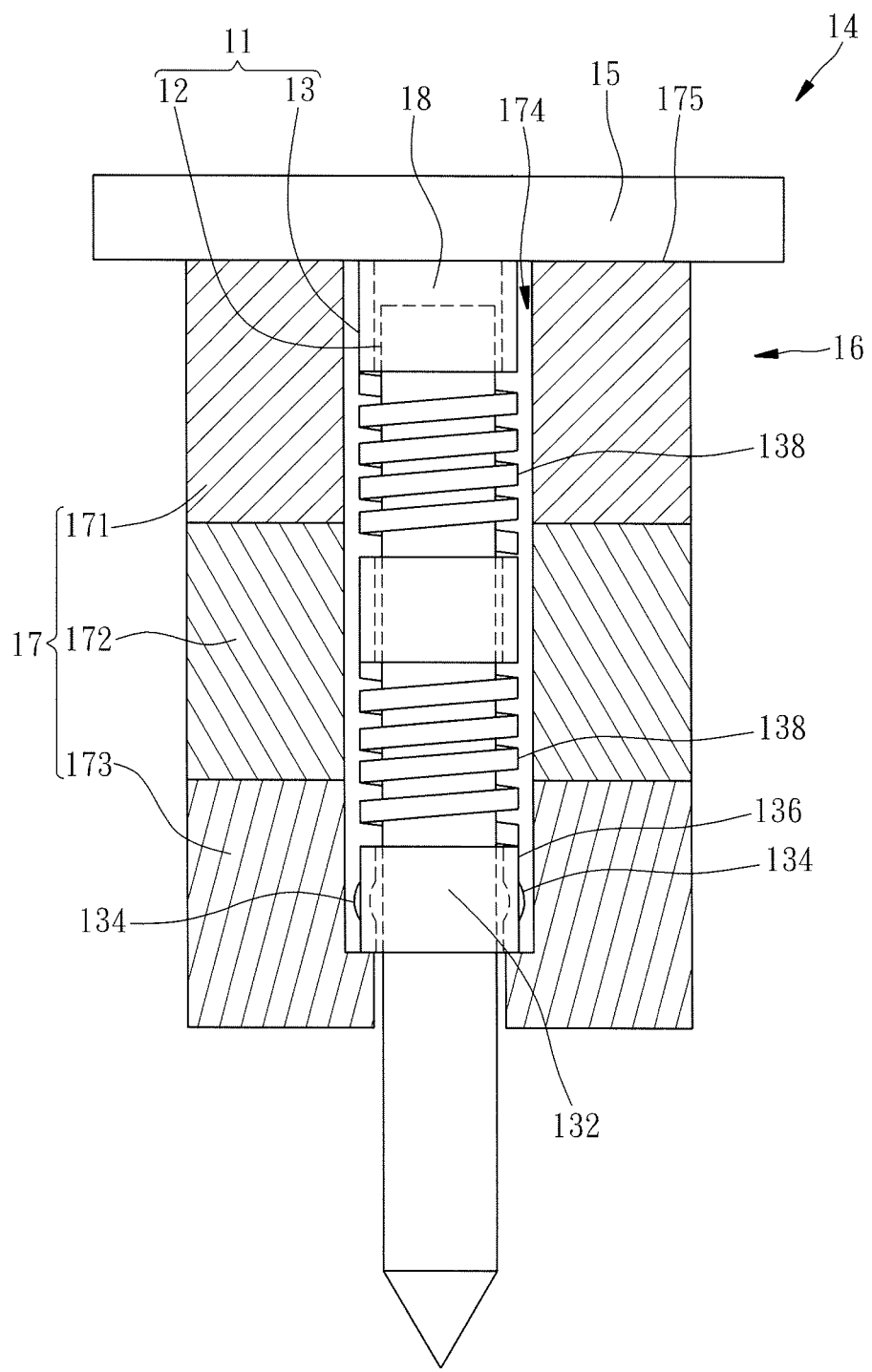
FIG. 2 is a schematic sectional view of a conventional probe card using the spring probe as shown in FIG. 1.
Figure 3:
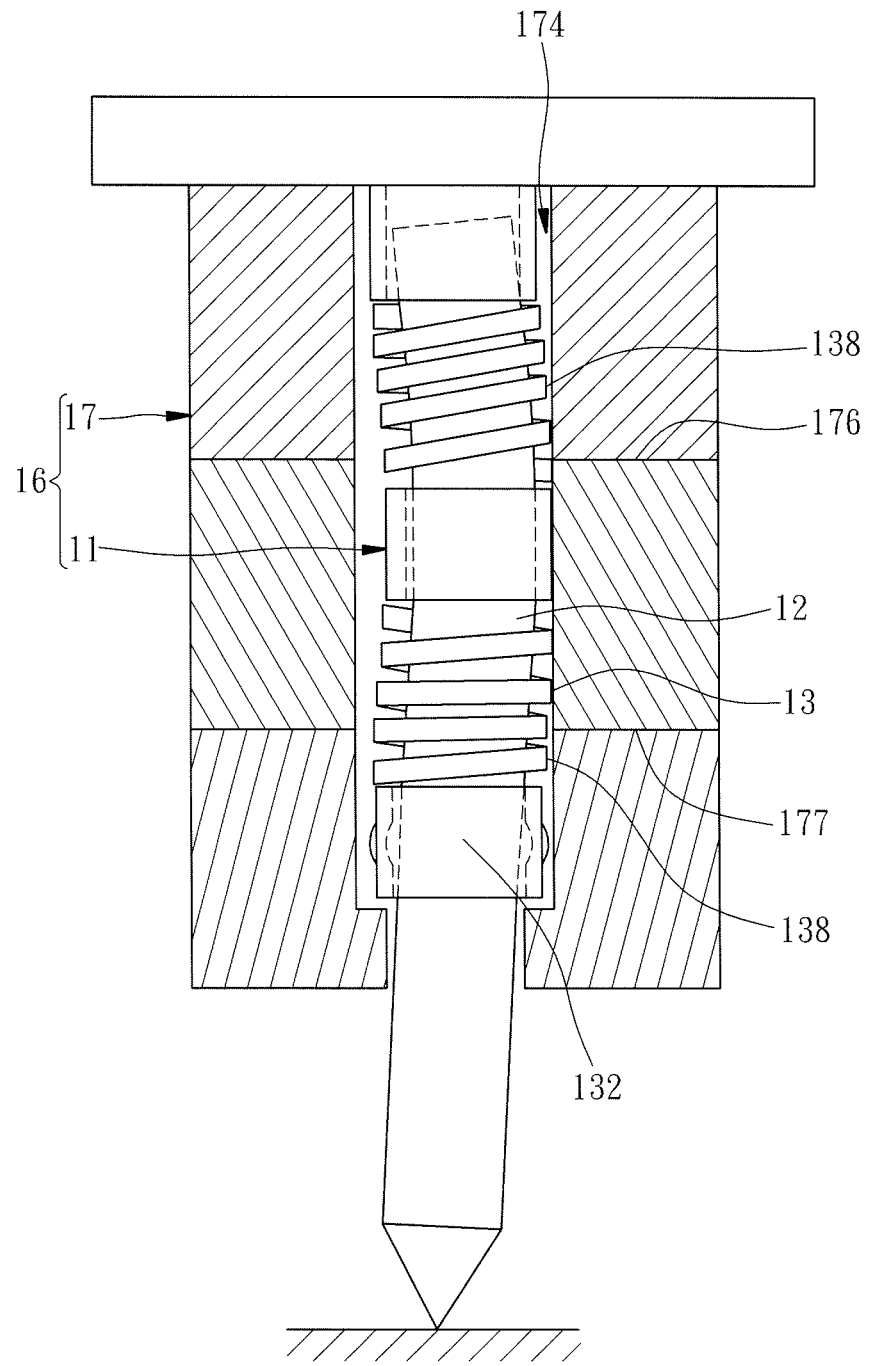
FIG. 3 is similar to FIG. 2, but showing the spring probe deflects and bends when receiving external force.
Figure 4:
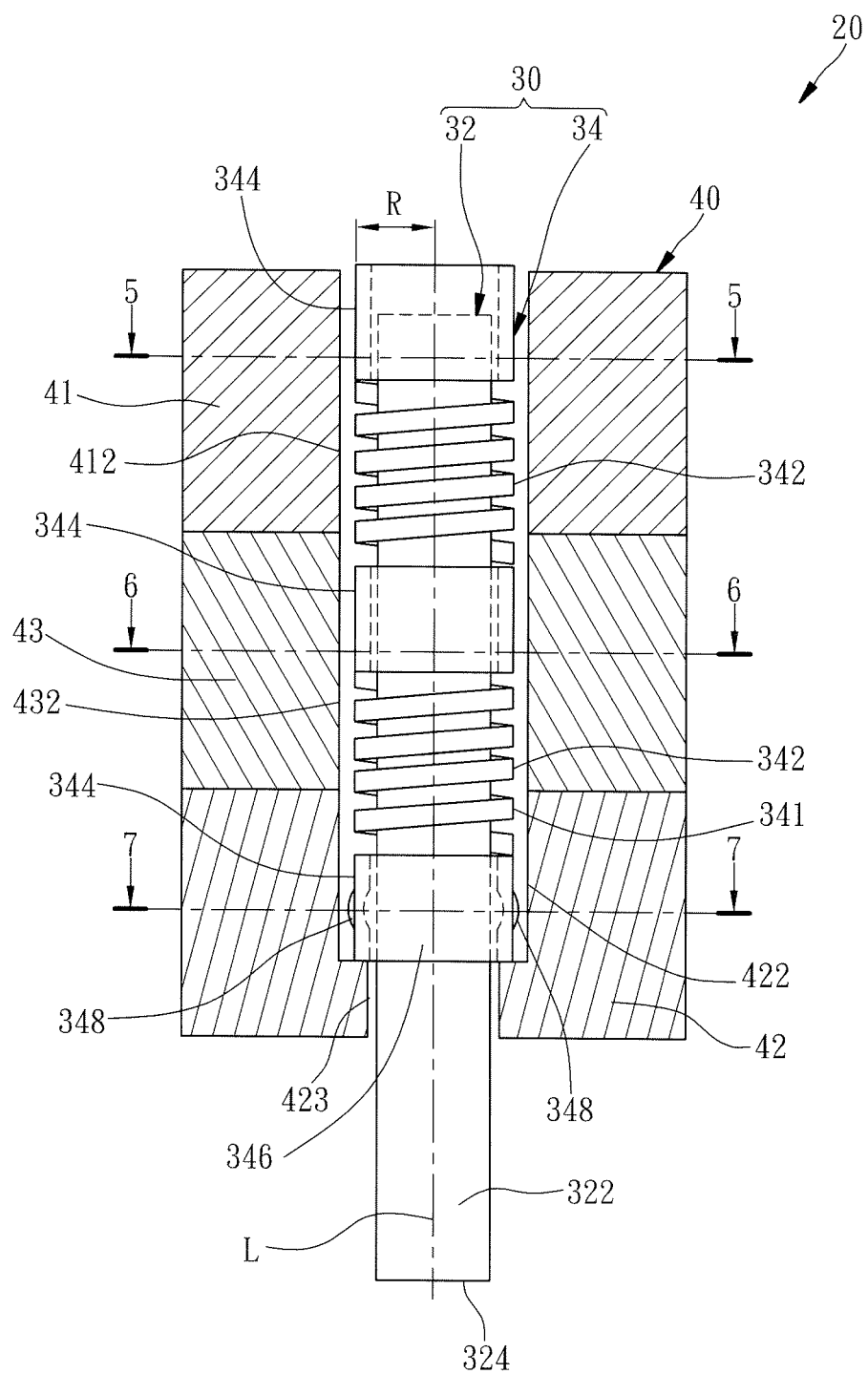
FIG. 4 is a schematic sectional view of a probe device having a spring probe according to a first preferred embodiment of the present invention.
Figure 5:
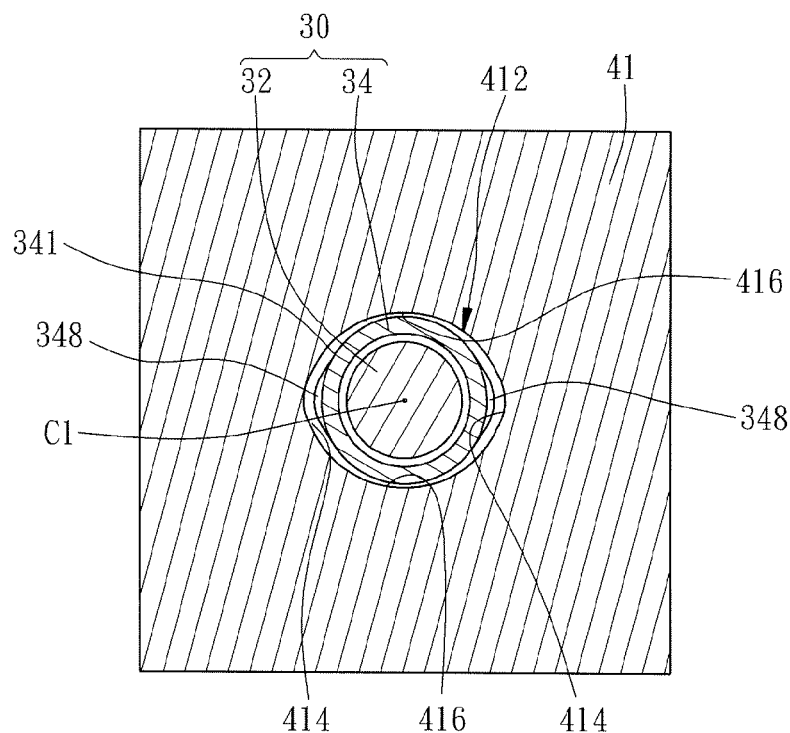
FIGS. 5-7 are sectional views taken along the lines 5-5, 6-6, and 7-7 in FIG. 4, respectively.
Figure 6:
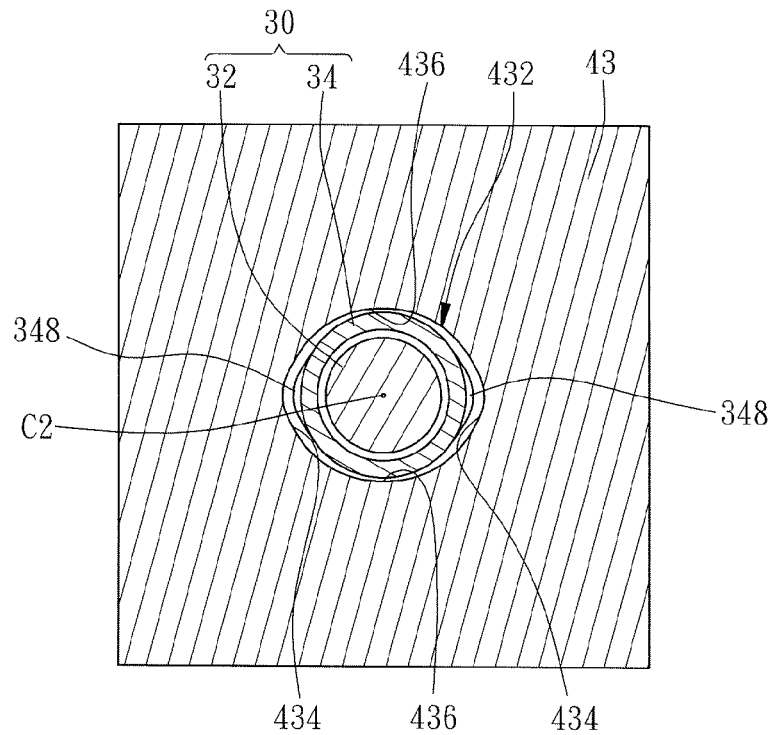
Figure 7:
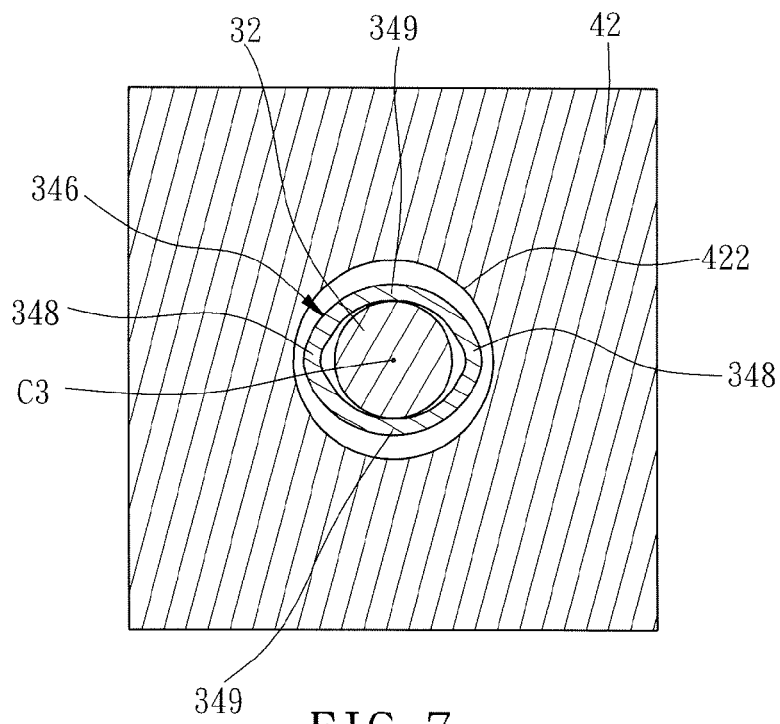

Resulted from the aforesaid press fixing process, the connection segment 346 is a little flattened and deformed from the original shape of circle ring having circular cross-sections to the shape of approximate elliptic ring having ellipse-like cross-sections, as shown in FIG. 7. As a result, the connection segment 346 is provided with two opposite convex portions 348 protruding over the outer cylinder surface 341 of the spring sections 342 (or over the other non-pressed parts of the spring sleeve 34), and two opposite fixing portions 349 fixed to the outer surface of the needle 32. Besides, the needle 32 has a probing section 322 protruding out of the spring sleeve 34 and having an end 324 for probing a DUT. In this embodiment, the end 324 is shaped as a plane, but may be shaped as an awl as shown in FIG. 2.

The probe device of the present invention is not only adapted for probing DUT by the ends 324 of the spring probes 30, but also able to serve as an interposer for connecting two elements, such as a circuit board and a space transformer, to make contact pads of the two elements be electrically connected with each other.

The probe seat 40 comprises an upper die 41, a lower die 42, and a middle die 43 disposed between the upper die 41 and the lower die 42. The upper die 41 has an upper guiding hole 412 penetrating therethrough, and the middle die 43 has a middle guiding hole 432 penetrating therethrough. Both of the upper guiding hole 412 and the middle guiding hole 432 have a non-circular profile. The lower die 42 is provided with a lower guiding hole 422 having a circular profile, and a through hole 423 communicating with the lower guiding hole 422 and having a radius smaller than the radius of the lower guiding hole 422. The upper, middle and lower guiding holes 412, 432, 422 and the through hole 423 are arranged to communicate with each other.

The upper and middle guiding holes 412, 432 have a profile substantially corresponding to the profile of the connection segment 346 of the spring sleeve 34. Specifically speaking, each of the upper and middle guiding holes 412, 432 is approximately complementary to the connection segment 346 in shape but greater than the connection segment 346 in size. The upper guiding hole 412 is defined with a center C1 which is substantially identical to the center of the needle 32, two guiding surfaces 414 approximately corresponding in shape to the convex portions 348 of the connection segment 346, and two supporting surfaces 416 approximately corresponding in shape to the fixing portions 349 of the connection segment 346. The distance between each supporting surface 416 and the center C1 is slightly greater than the radius R of the outer cylinder surface 341 of the spring sleeve 34. The distance between each guiding surface 414 and the center C1 is greater than the distance between each supporting surface 416 and the center C1 and slightly greater than the maximum distance between each convex portion 348 and the center of the needle 32. The middle guiding hole 432 has a profile same as that of the upper guiding hole 412, and defined with a center C2, two guiding surfaces 434 and two supporting surfaces 436. The distance between each supporting surface 436 and the center C2 is slightly greater than the radius R of the outer cylinder surface 341 of the spring sleeve 34. The distance between each guiding surface 434 and the center C2 is greater than the distance between each supporting surface 436 and the center C2 and slightly greater than the maximum distance between each convex portion 348 and the center of the needle 32. As to the lower guiding hole 422, as shown in FIG. 7, it is a circular hole defined with a center C3 and a radius slightly greater than the maximum distance between each convex portion 348 and the center of the needle 32. The center of the needle 32 is substantially identical to the center C3 of the circular hole. The centers C1, C2, C3 of the upper, middle and lower guiding holes 412, 432, 422 are substantially aligned in the same imaginary axis L which is identical to the central axis of the needle 32. However, assembly error of the dies 41, 42, 43 may cause the centers C1, C2, C3 of the guiding holes 412, 432, 422 to offset from the imaginary axis L.

Resulted from the aforesaid configuration design of the guiding holes 412, 422, 432, in the process of installing the spring probe 30 into the probe seat 40, the connection segment 346 of the spring sleeve 34 passes through the upper guiding hole 412 in a way that the two convex portions 348 face the two guiding surfaces 414 respectively, and then the connection segment 346 passes through the middle guiding hole 432 in a way that the two convex portions 348 face the two guiding surfaces 434 respectively, and thereafter the connection segment 346 is positioned in the lower guiding hole 422 of the lower die 42 in a way that a lower section of the needle 32 is inserted through the through hole 423, so that the probing section 322 protrudes out of the lower die 42. In this way, a bottom surface of the non-spring section 344 provided with the connection segment 346 is supported on a bottom surface of the lower guiding hole 422. As a result, the spring probe 30 is kept in the upper, middle and lower dies 41, 43, 42 and prevented from escape from the probe seat 40. By this design, the spring sleeve 34 is located in the guiding holes 412, 422, 432, and the supporting surfaces 416, 436 of the upper and middle guiding holes 412, 432 are so close to the outer cylinder surface 341 as to limit the position of the spring sleeve 34, thereby preventing the spring probe 30 from exceeding deflection and bending when the spring probe 30 receives external force.

Figure 13:
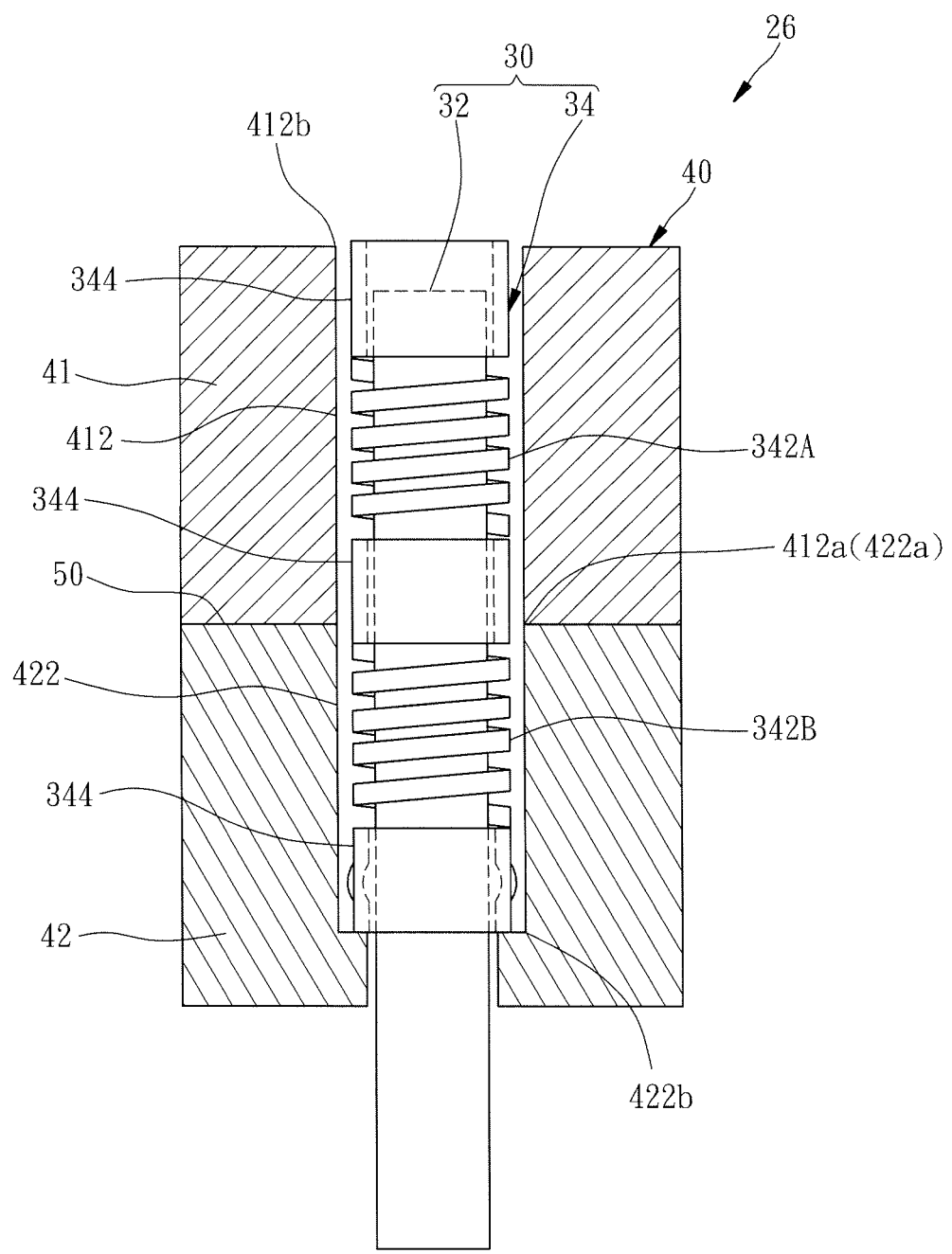
FIG. 13 is a schematic sectional view of a probe device having a spring probe according to a seventh preferred embodiment of the present invention.

On the other hand, the probe seat 40 may be configured in a way that the juncture of the upper and middle dies 41, 43, such as the juncture 50 shown in FIG. 13, is arranged corresponding in position to a non-spring section 344, and the juncture of the middle and lower dies 43, 42 is arranged corresponding in position to another non-spring section 344. In this way, although the non-spring sections 344 will slightly move when the spring probe 30 is in probing, the non-spring sections 344 will still face the junctures, which means the junctures will still correspond in position to the non-spring sections 344, so that the spring sections 342 are prevented from interference with the junctures when being compressed and released. This feature will be specifically described in a seventh preferred embodiment in the paragraphs hereunder.

It is to be mentioned that the amount of the spring section 342 of the spring sleeve 34 is unlimited. The spring sleeve 34 may has only one spring section 342 or more than two spring sections 342. In the case that the spring sleeve 34 has only one spring section 342, the probe seat 40 usually comprises only the upper and lower dies 41, 42 without such middle die 43. In the aforesaid embodiment, the spring sections 342 of the spring sleeve 34 helically extend in the same helical direction; in this case, or in another case that the spring sleeve 34 has only one spring section 342, when the end 324 of the needle 32 receives external force to cause the spring sections 342 to be compressed elastically, the spring sections 342 will have torque in the same rotational direction and drive the whole spring probe 30 to rotate. Because the lower guiding hole 422 in the aforesaid embodiment is circular, even though the spring probe 30 rotates, the convex portions 348 of the spring sleeve 34 won't be abutted against the inner wall of the lower guiding hole 422.

Figure 8:
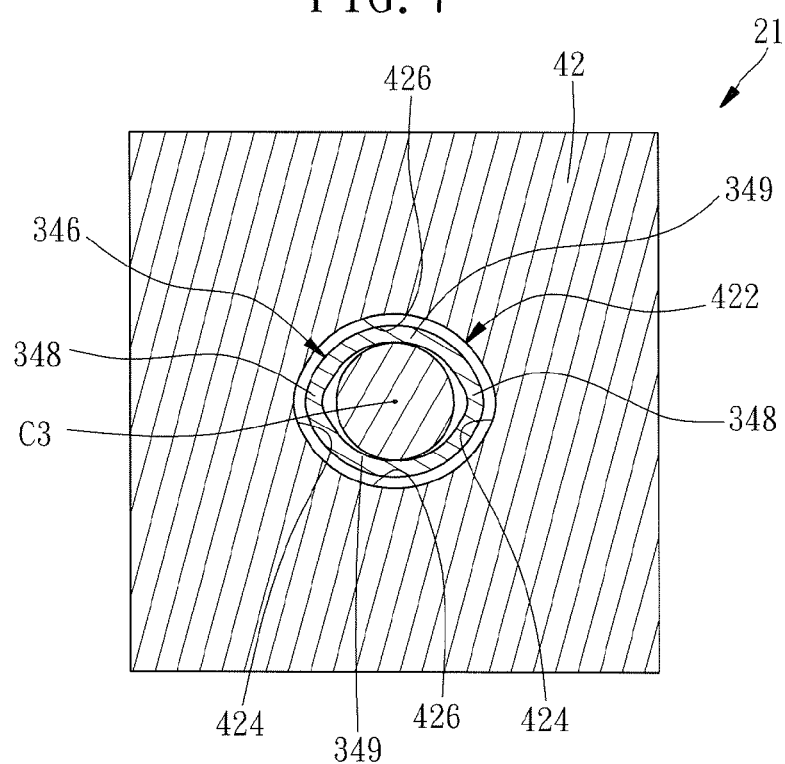
FIG. 8 is a schematic sectional view similar to FIG. 7, showing a probe device having a spring probe according to a second preferred embodiment of the present invention.

However, in order to obtain more preferable position restricting effect, the lower guiding hole 422 may be configured having a non-circular profile, such as the lower guiding hole 422 of the probe device 21 according to a second preferred embodiment of the present invention, as shown in FIG. 8. The lower guiding hole 422 of the probe device 21 has a same profile with the aforesaid guiding holes 412, 432, and is defined with a center C3, two first supporting surfaces 424 facing the convex portions 348 respectively, and two second supporting surfaces 426 facing the fixing portions 349 respectively. The distance between each second supporting surface 426 and the center C3 is slightly greater than the radius R of the outer cylinder surface 341 of the spring sleeve 34. The distance between each first supporting surface 424 and the center C3 is slightly greater than the distance between each second supporting surface 426 and the center C3 and also slightly greater than the maximum distance between each convex portion 348 and the center of the needle 32. The center of the needle 32 is substantially identical to the center C3. In this way, the first and second supporting surfaces 424, 426 of the lower guiding hole 422 can effectively limit the position of the spring sleeve 34, so that the spring probe 30 is less possible to deflect and bend.

Figure 9:
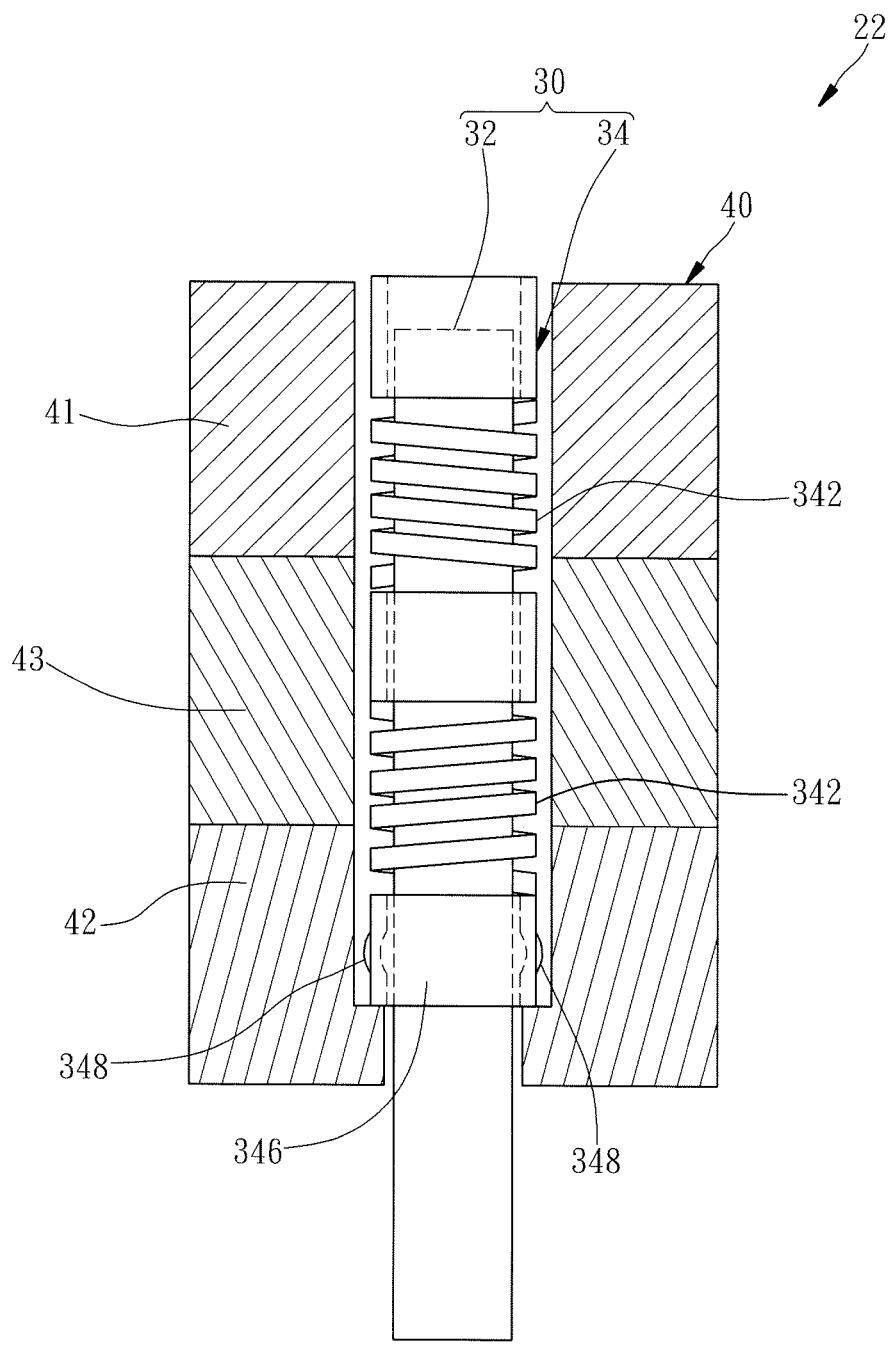
FIG. 9 is a schematic sectional view of a probe device having a spring probe according to a third preferred embodiment of the present invention.

In the case that the lower guiding hole 422 has non-circular profile, the spring probe is better to be configured in a way that it will not rotate when receiving external force, so that the convex portions 348 of the spring sleeve 34 are prevented from being abutted against the inner wall of the lower guiding hole 422 to cause failure of elasticity of the spring probe 30. For example, in a probe device 22 according to a third preferred embodiment as shown in FIG. 9, the spring sleeve 34 of the spring probe 30 has two spring sections 342 which helically extend in two reverse helical directions respectively. In this way, when the two spring sections 342 are deformed elastically, the torque of one of the spring sections 342 will be counteracted by the torque of the other spring section 342, so that the spring probe 30 is less possible to rotate when receiving external force. As mentioned in the first preferred embodiment, the probe seat 40 may be configured in a way that the juncture of the upper and middle dies 41, 43 and the juncture of the middle and lower dies 43, 42 are arranged corresponding in position to two non-spring sections 344 respectively, so that the spring sections 342 are prevented from interference with the junctures when being compressed and released.

Figure 10:
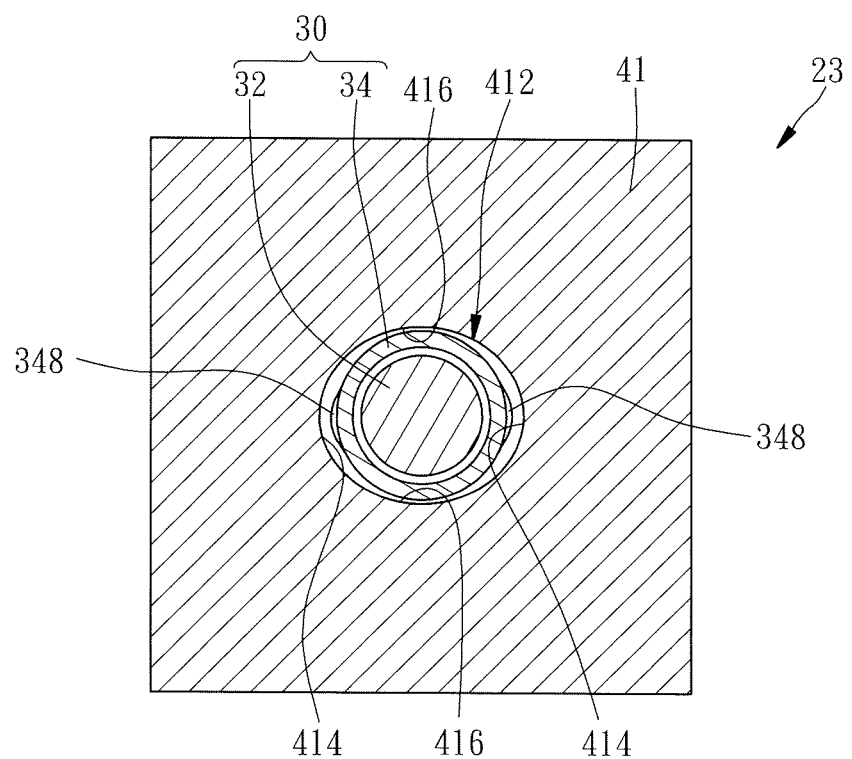
FIG. 10 is a schematic sectional view similar to FIG. 5, showing a probe device having a spring probe according to a fourth preferred embodiment of the present invention.

The aforesaid non-circular guiding holes 412, 422, 432 are not limited to be shaped as ellipses or corresponding to the connection segment 346, but should have the guiding surface and supporting surface as defined above. For example, in the probe device 23 according to a fourth preferred embodiment as shown in FIG. 10, the upper guiding hole 412, or middle or lower guiding hole, is shaped as an ellipse; the part of the inner wall of the upper guiding hole 412, which has relatively smaller radius of curvature, serves as the guiding surface 414 as defined above, and the part of the inner wall of the upper guiding hole 412, which has relatively larger radius of curvature, serves as the supporting surface 416 as defined above. In this way, the ellipse-shaped upper guiding hole 412, or middle or lower guiding hole, can effectively limit the position of the spring sleeve 34, thereby preventing the spring probe 30 from exceeding deflection and bending. Besides, the upper die 41, or middle or lower die, which has such ellipse-shaped guiding hole, is relatively easier in manufacturing and in installation of the spring probe 30.

Figure 11:
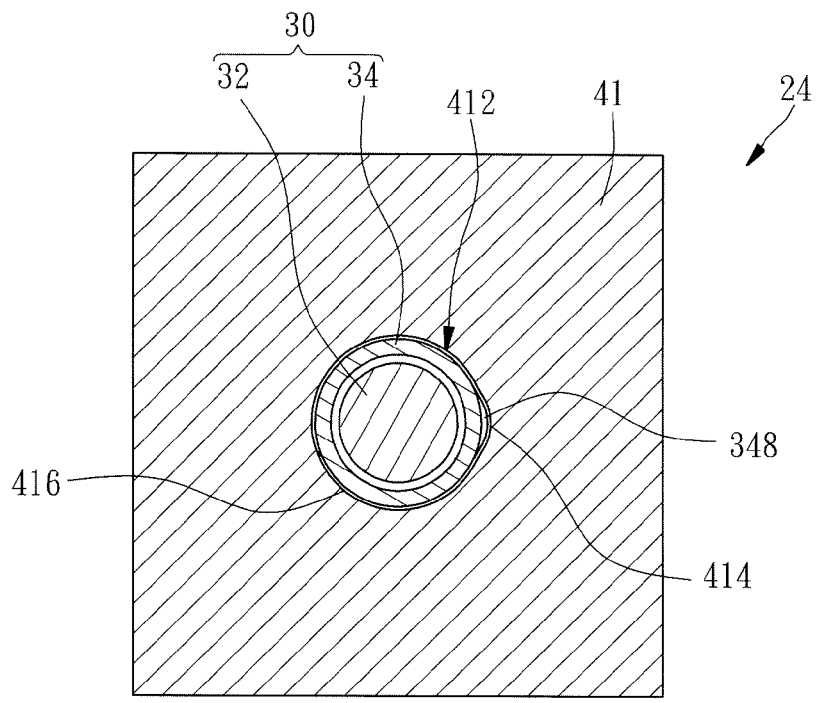
FIG. 11 is a schematic sectional view similar to FIG. 5, showing a probe device having a spring probe according to a fifth preferred embodiment of the present invention.
Figure 12:
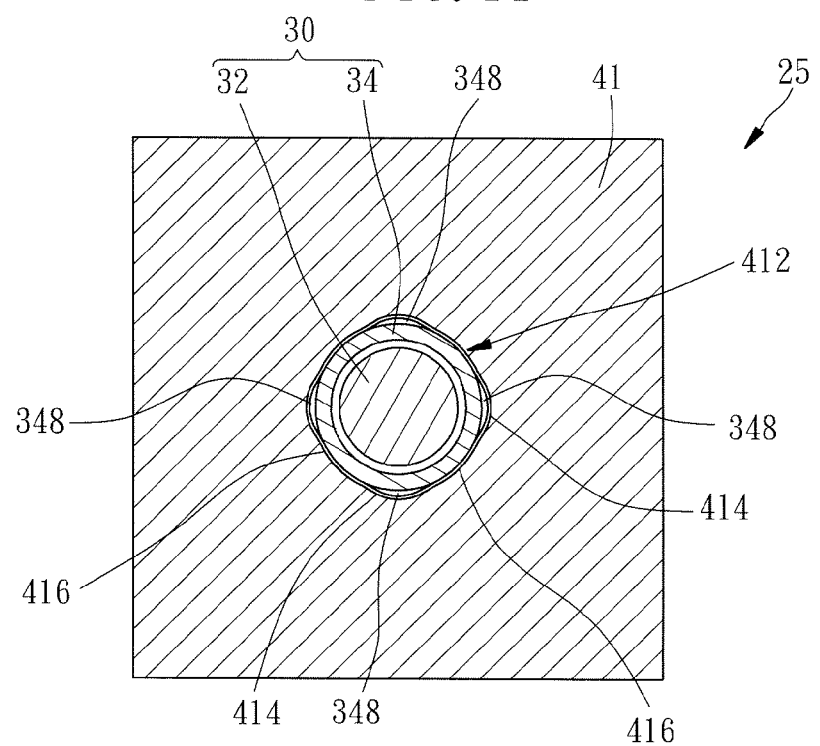
FIG. 12 is a schematic sectional view similar to FIG. 5, showing a probe device having a spring probe according to a sixth preferred embodiment of the present invention.

It is to be mentioned that the shape of the connection segment 346 of the spring sleeve 34 may vary based on various ways of press fixing the connection segment 346 to the needle 34, so the connection segment 346 is not limited to have two convex portions 348. For example, in a probe device 24 according to a fifth preferred embodiment of the present invention as shown in FIG. 11, the spring sleeve 34 has only one convex portion 348. Alternately, the connection segment 346 may have more than two convex portions 348, and the amount of the convex portion 348 may be an even number or an odd number. For example, in a probe device 25 according to a sixth preferred embodiment of the present invention as shown in FIG. 12, the spring sleeve 34 has four convex portions 348. As shown in FIGS. 11-12, as long as the upper guiding hole 412, or middle or lower guiding hole, has the guiding surface 414 and supporting surface 416 corresponding in amount to the convex portion 348 of the connection segment 346, it can allow passing of the connection segment 346 therethrough and limit the position of the spring probe 30.

For preventing the spring section of the spring sleeve of the spring probe from contacting uneven inner wall of the guiding hole and getting jammed when it is moved and deformed elastically, the primary technical feature of the present invention is that upper and lower edges of the guiding hole of the probe seat are arranged corresponding in position to the non-spring section of the spring sleeve. This feature is realized by many embodiments which will be specified in the following contents.

Referring to FIG. 13, in a probe device 26 according to a seventh preferred embodiment of the present invention, the probe seat 40 is only composed of the upper and lower dies 41, 42 without aforesaid middle die 43. Besides, the juncture 50 of the upper and lower dies 41, 42 is arranged corresponding in position to one of the non-spring sections 344 of the spring sleeve 34. In this way, a lower edge 412a of the upper guiding hole 412 and an upper edge 422a of the lower guiding hole 422 are connected with each other and arranged corresponding in position to the same non-spring section 344; an upper edge 412b of the upper guiding hole 412 and a lower edge 422b of the lower guiding hole 422 are arranged corresponding in position to the other two non-spring sections 344, respectively. As a result, even the assembly error causes the inner walls of the guiding holes 412, 422 of the upper and lower dies 41, 42 uneven with each other, the spring sections 342 are less possible to contact the uneven juncture 50 and get jammed.

In the case that the probe seat 40 comprises upper, middle and lower dies 41, 43, 42, such as the following eighth, ninth and tenth preferred embodiments, a juncture 51 of the upper and middle dies 41, 43 and a juncture 52 of the middle and lower dies 43, 42 may be arranged corresponding in position to two non-spring sections 344 respectively, so that the aforesaid effect of preventing the spring section from getting jammed is achieved. In fact, the probe seat in the present invention is not limited to be composed of two or three dies, but may be composed of more than three dies; besides, the spring sleeve may have more than three non-spring sections. As long as the junctures of the dies are arranged corresponding in position to the non-spring sections of the spring sleeve, the spring sections are prevented from interference with the junctures when being compressed and released.

Figure 14:
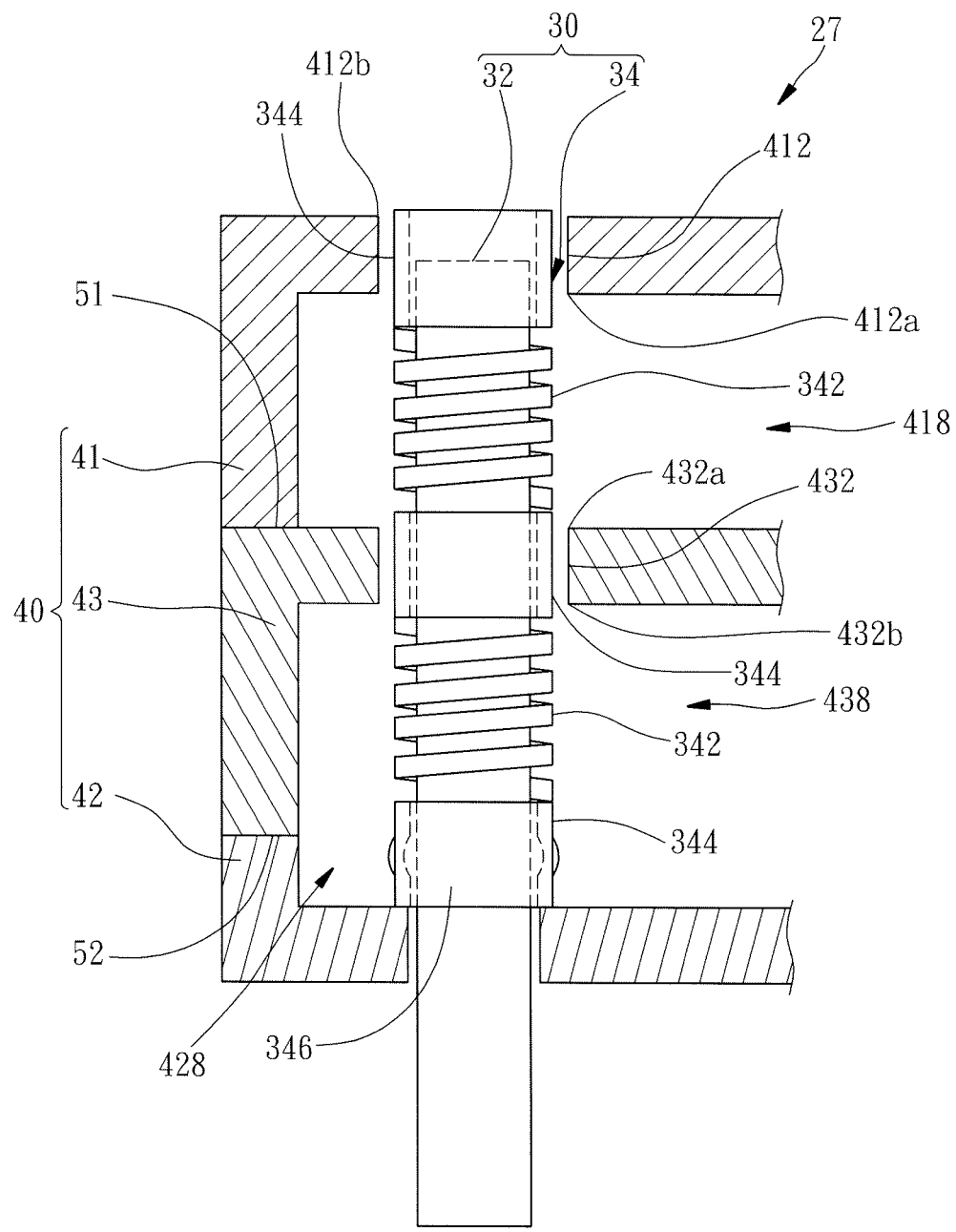
FIG. 14 is a schematic sectional view of a probe device having a spring probe according to an eighth preferred embodiment of the present invention.
Figure 15:
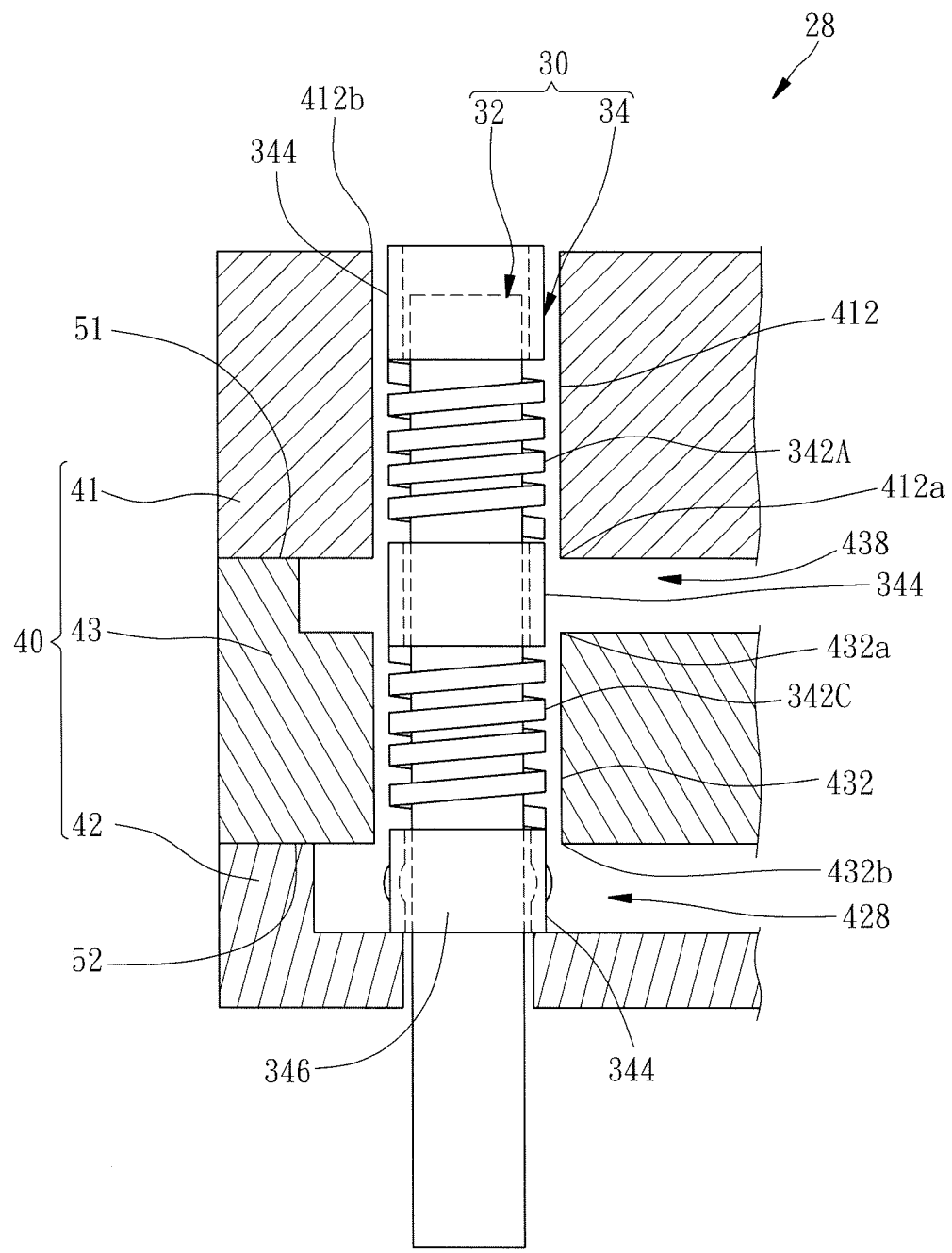
FIG. 15 is a schematic sectional view of a probe device having a spring probe according to a ninth preferred embodiment of the present invention, showing a part of the probe device at an edge thereof.
Figure 16:
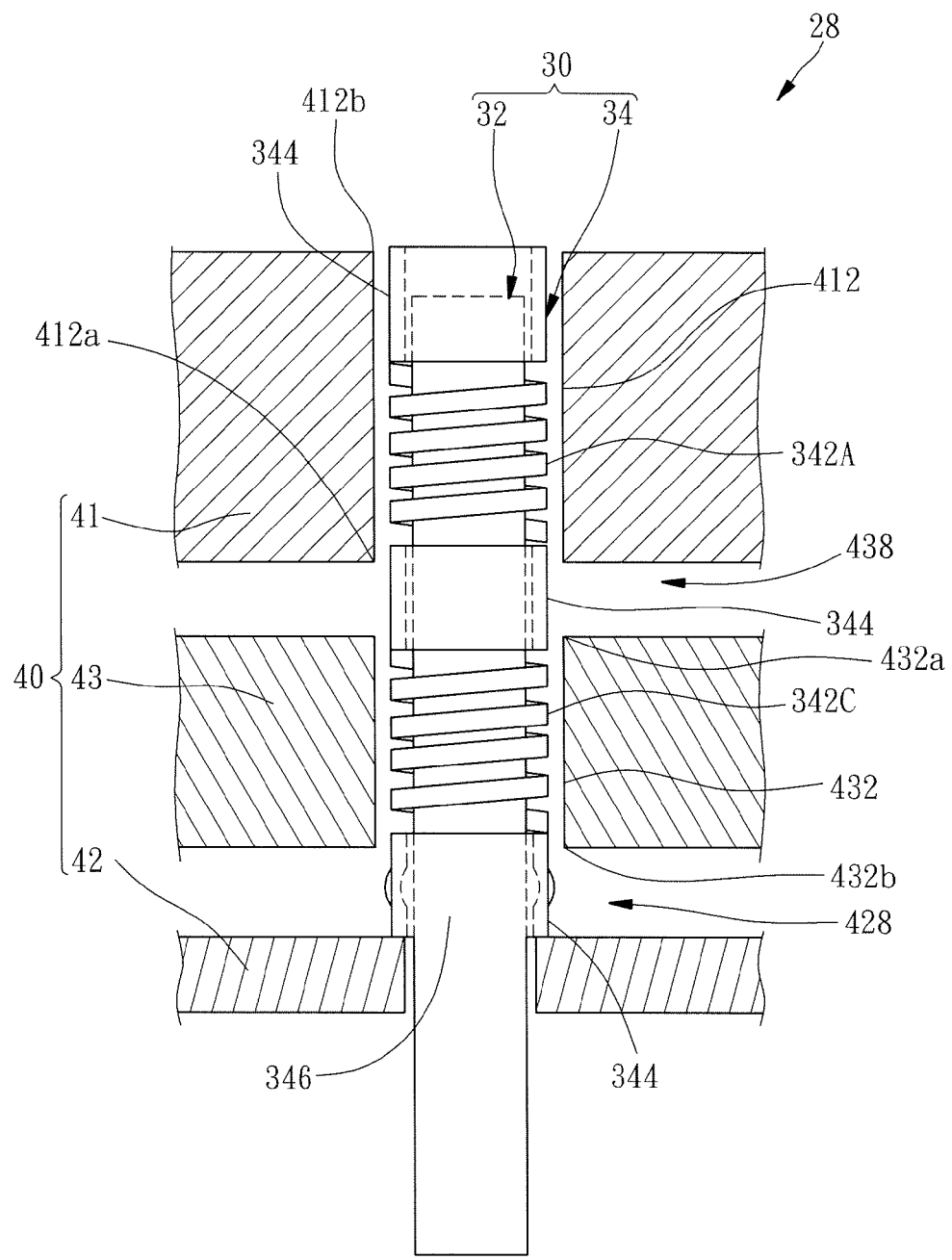
FIG. 16 is similar to FIG. 15, but showing another part of the probe device, which is not adjacent to any edge of the probe device.

In a probe device 27 according to an eighth preferred embodiment of the present invention as shown in FIG. 14 and a probe device 28 according to a ninth preferred embodiment of the present invention as shown in FIGS. 15-16, the lower die 42 of the probe seat 40 may have no such guiding hole but have a semi-open space 428 for accommodating the connection segment 346 of the spring probe 30. The probe device 27 is partially shown in FIG. 14. The part shown in FIG. 14 is located at an edge of the spring probe 27 and includes the spring probe 30 nearest to the edge. The connection segment 346 of the spring probe 30 shown in FIG. 14 and the connection segments 346 of the other spring probes 30 of the probe device 27, which are not shown in FIG. 14, each are located in the same space 428, instead of located in a lower guiding hole. The probe device 28 is partially shown in FIGS. 15-16. The part shown in FIG. 15 is located at an edge of the spring probe 28 and includes the spring probe 30 nearest to the edge. The part shown in FIG. 16 is not located adjacent to any edge of the spring probe 28 and includes a spring probe 30 not located adjacent to any edge. The connection segments 346 of the spring probes 30 shown in FIGS. 15-16 and the connection segments 346 of the other spring probes 30 of the probe device 28, which are not shown in FIGS. 15-16, each are located in the same space 428, instead of located in a lower guiding hole.

Figure 17:
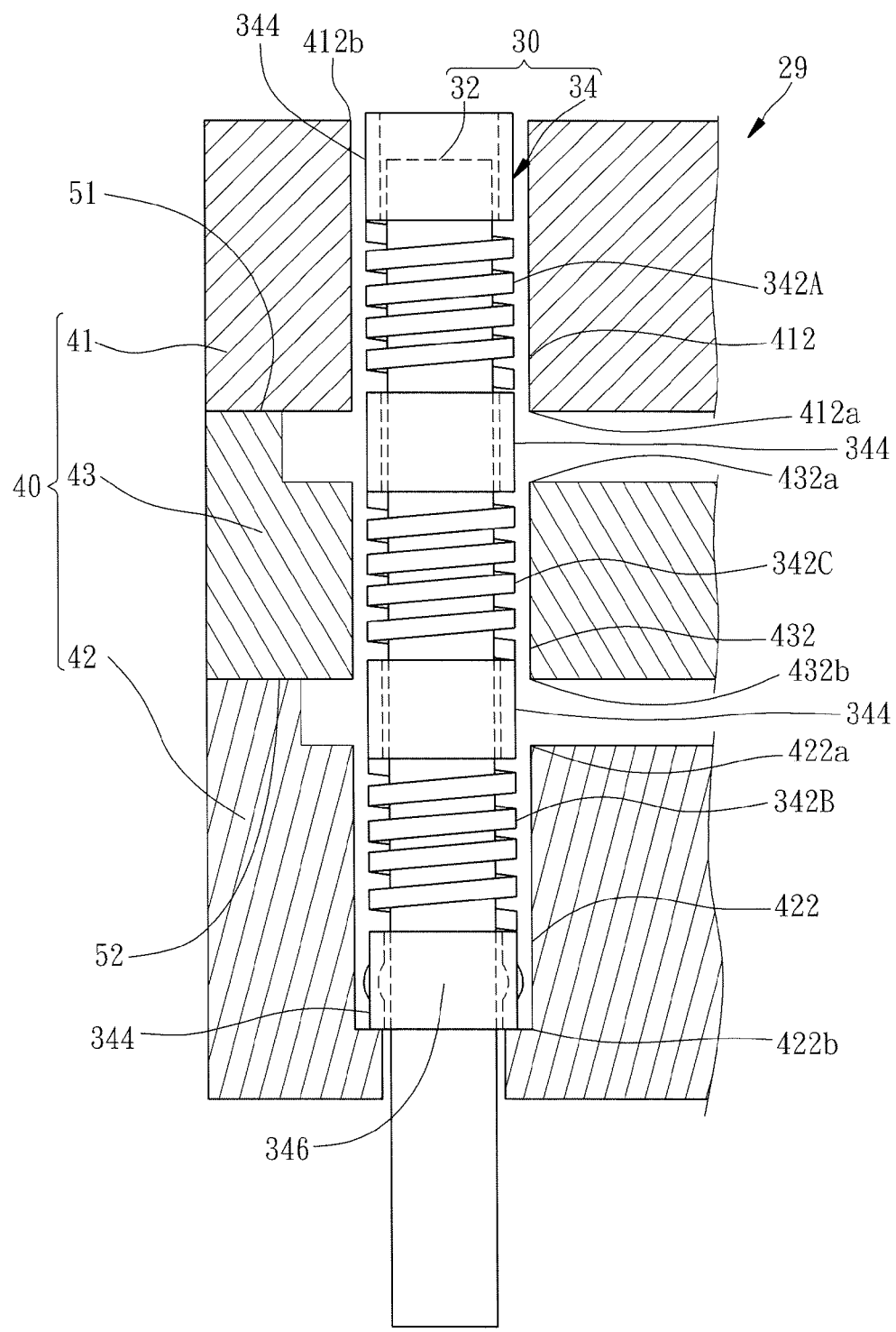
FIG. 17 is a schematic sectional view of a probe device having a spring probe according to a tenth preferred embodiment of the present invention, showing a part of the probe device at an edge thereof.
Figure 18:
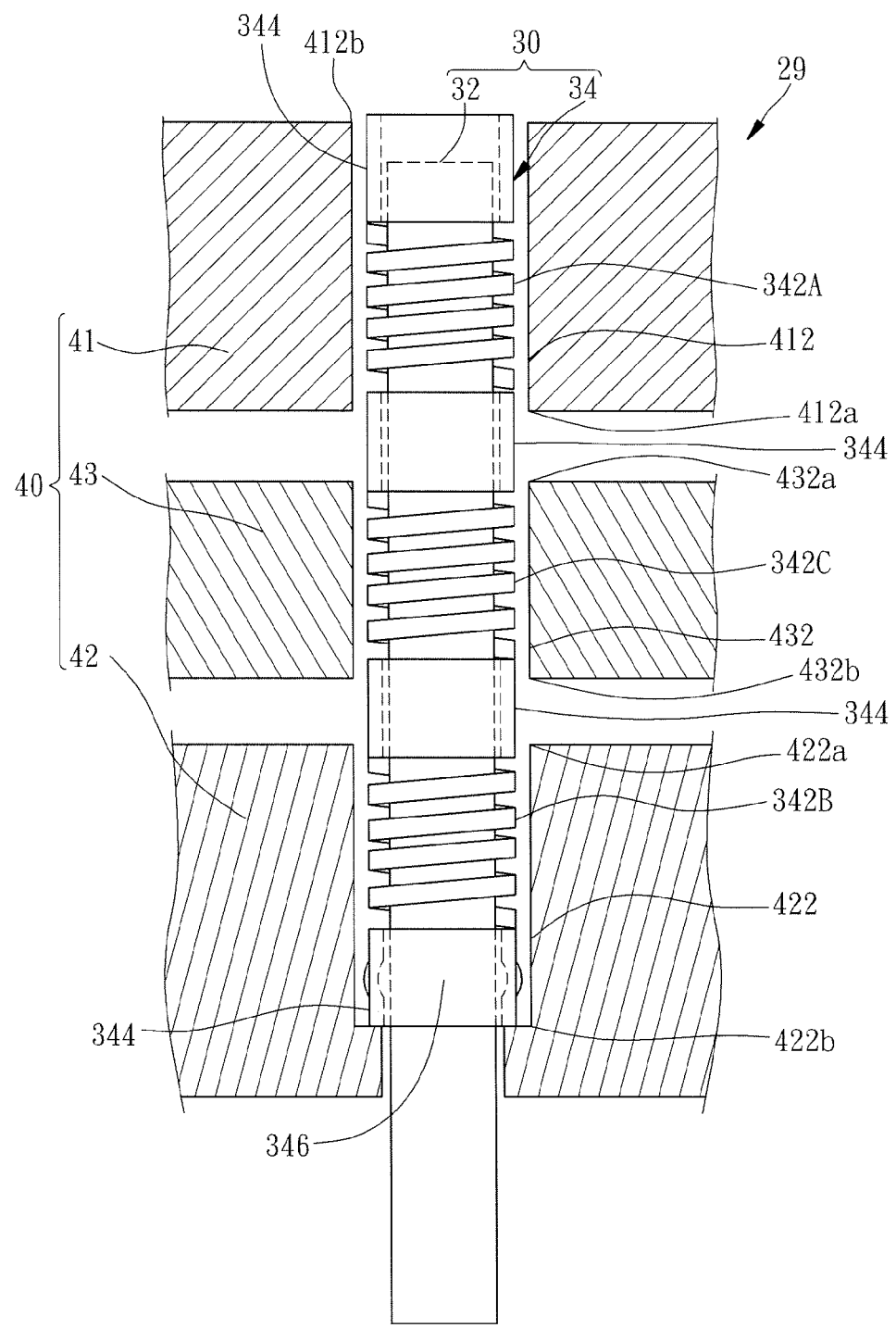
FIG. 18 is similar to FIG. 17, but showing another part of the probe device, which is not adjacent to any edge of the probe device.

Besides, the upper and middle guiding holes 412, 432 are not limited to be connected with each other. In FIG. 14, the upper die 41 is provided with a space 418 located between the upper and middle guiding holes 412, 432, and the middle die 43 is also provided with a space 438 communicating with the space 428 of the lower die 42. The two spaces 418, 438 are arranged corresponding in position to the two spring sections 342, respectively. In FIGS. 15-16, the middle die 43 is provided with a space 438 which is located between the upper and middle guiding holes 412, 432 and arranged corresponding in position to one of the non-spring sections 344, and the middle guiding hole 432 is located between the space 438 of the middle die 43 and the space 428 of the lower die 42. A probe device 29 according to a tenth preferred embodiment of the present invention is partially shown in FIGS. 17-18. The part shown in FIG. 17 is located at an edge of the probe device 29 and includes the spring probe 30 nearest to the edge. The part shown in FIG. 18 is not located adjacent to any edge of the probe device 29 and includes a spring probe 30 not located adjacent to any edge. As shown in FIGS. 17-18, the middle and lower guiding holes 432, 422 may not be connected with each other. The connection segments 346 of the spring probes 30 shown in FIGS. 17-18 each are located in a lower guiding hole 422.

In the probe device 27 shown in FIG. 14, the guiding holes 412, 432 of the probe seat 40 are completely arranged corresponding in position to two non-spring sections 344 of the spring sleeve 34, respectively. This means the upper and lower edges of the same guiding hole are located corresponding to the same non-spring section. This feature can effectively prevent the spring sections 342 from contacting the upper and lower edges of the guiding holes 412, 432 and getting jammed. In the probe devices 26, 28, 29 shown in FIGS. 13 and 15-18, the spring sections of the spring sleeve 34 are completely arranged corresponding in position to the guiding holes 412, 422, 432 of the probe seat 40, which means none of any part of each spring section is arranged corresponding in position to the spaces 428, 438. Specifically speaking, the spring sections of the spring sleeve 34 in FIG. 13 comprise an upper spring section 342A corresponding in position to the upper guiding hole 412 completely, and a lower spring section 342B corresponding in position to the lower guiding hole 422 completely. The spring sections of the spring sleeve 34 in FIGS. 15-18 comprise an upper spring section 342A corresponding in position to the upper guiding hole 412 completely, and a middle spring section 342C corresponding in position to the middle guiding hole 432 completely. Besides, the spring sleeve 34 in FIGS. 17-18 further comprise a lower spring section 342B corresponding in position to the lower guiding hole 422 completely. This feature can effectively prevent the spring sections 342A, 342B, 342C from contacting the upper and lower edges of the guiding holes 412, 422, 432 and getting jammed. In other words, the spring sleeve 34 of the probe device 29 shown in FIGS. 17-18 has three spring sections 342A, 342C, 342B which are completely located in the upper, middle and lower guiding holes 412, 432, 422, respectively. Such configuration design can effectively prevent the spring sections 342A, 342B, 342C from contacting the upper and lower edges of the guiding holes 412, 422, 432 and getting jammed; besides, the spring sleeve 34 has very good elasticity.

It is to be mentioned that the lower die 42 in FIG. 14 is similar to the lower die 42 in FIG. 15; the upper die 41 in FIG. 14 and the upper die 41 in FIG. 15 are quite different from each other but replaceable by each other; the middle die 43 in FIG. 14 and the middle die 43 in FIG. 15 are quite different from each other but replaceable by each other. This means the probe seat 40 may be composed of the upper die 41 in FIG. 14, the middle die 43 in FIG. 15, and the lower die 42 in FIG. 14 or 15; alternately, the probe seat 40 may be composed of the upper die 41 in FIG. 15, the middle die 43 in FIG. 14, and the lower die 42 in FIG. 14 or 15; such probe seat 40 has the same effect with the aforesaid probe seat 40. In other words, the feature that the spring section of the spring sleeve is arranged corresponding in position to the guiding hole of the probe seat completely can be combined with the feature that the guiding hole of the probe seat is arranged corresponding in position to the non-spring section of the spring sleeve completely in a probe device of the present invention. This means the former of the aforesaid two features may be adopted by parts of the spring sleeve and the probe seat, and the latter of the aforesaid two features may be adopted by the other parts of the spring sleeve and the probe seat, thereby preventing the spring sleeve from getting jammed. No matter what kind of combination the probe seat 40 is, it is unrelated to the profile of the guiding holes to be adopted by the dies.

Figure 19:
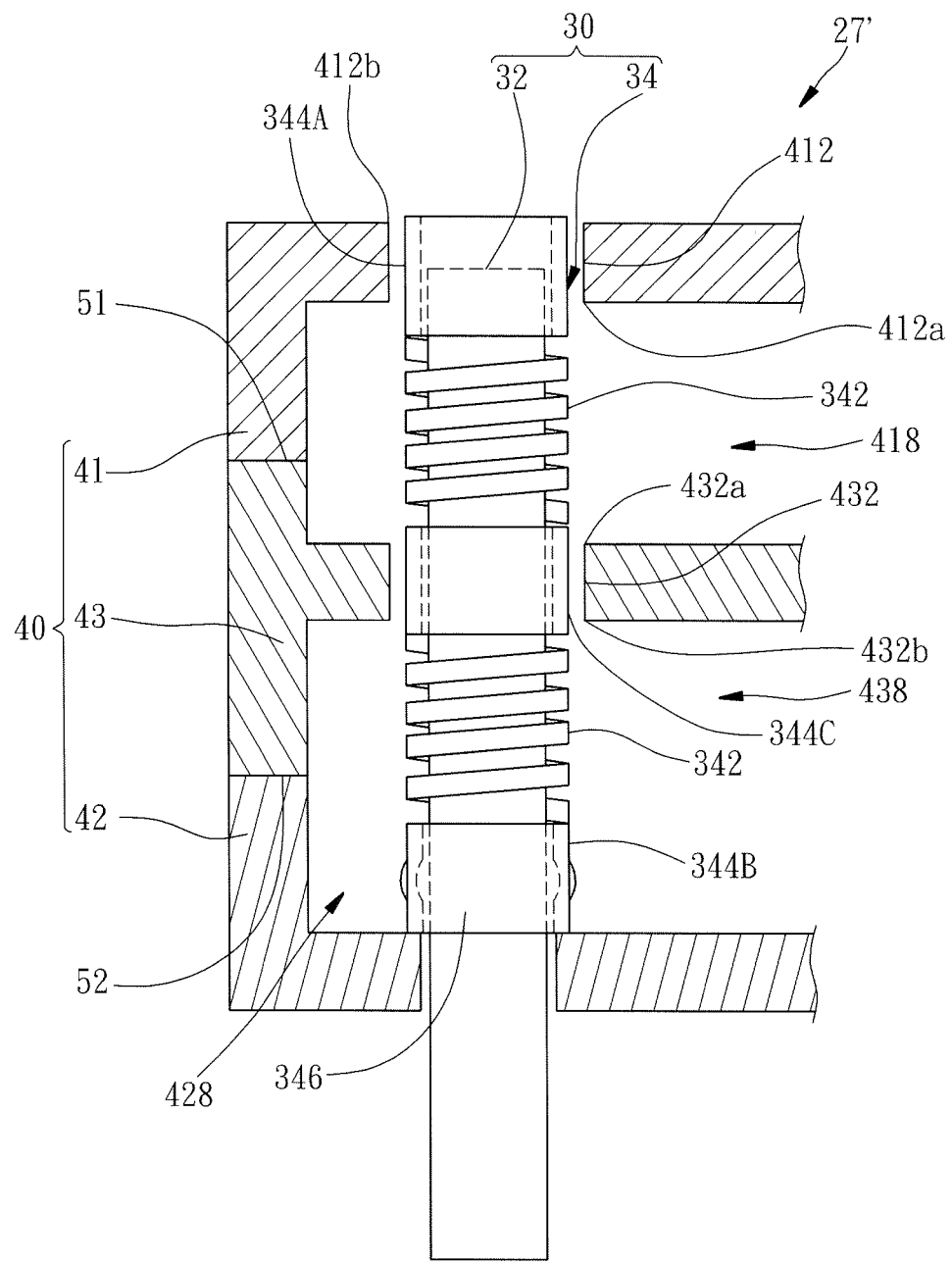
FIG. 19 is a schematic sectional view of a probe device having a spring probe according to an eleventh preferred embodiment of the present invention.

Referring to FIG. 19, a probe device 27' according to an eleventh preferred embodiment of the present invention is similar to the probe device 27 in the aforesaid eighth preferred embodiment as shown in FIG. 14. However, in this embodiment, the juncture 51 of the upper and middle dies 41, 43 is arranged corresponding in position to one of the spring sections 342, and the juncture 52 of the middle and lower dies 43, 42 is arranged corresponding in position to another of the spring sections 342. As the aforesaid eighth preferred embodiment, in this eleventh embodiment, the guiding holes of the probe seat are arranged corresponding in position to the non-spring sections of the spring sleeve completely. Specifically speaking, the non-spring sections of the spring sleeve 34 comprise an upper non-spring section 344A, a lower non-spring section 344B fixed to the needle 32, and a middle non-spring section 344C. The spring sections 342 and the middle non-spring section 344C are located between the upper and lower non-spring sections 344A, 344B. The upper guiding hole 412 is arranged corresponding in position to the upper non-spring section 344A completely. The middle guiding hole 432 is arranged corresponding in position to the middle non-spring section 344C completely. In this way, although the junctures 51, 52 of the dies are arranged corresponding in position to the spring sections 342 of the spring sleeve 34 rather than the non-spring sections, the spring sections 342 are completely located in the semi-open spaces 418, 438, 428 and have none of any part thereof located in the guiding holes 412, 432. Therefore, the spring sections 342 of the spring sleeve 34 are prevented from contacting the upper and lower edges of the guiding holes 412, 432 of the probe seat 40, thereby prevented from getting jammed. As shown in FIGS. 14 and 19, the positions of the junctures 51, 52 of the dies are not limited to be arranged as in the aforesaid embodiments, but adjustable according to practical demands. For example, the juncture 51 may be arranged corresponding in position to one of the spring sections 342 as shown in FIG. 19 while the juncture 52 is arranged corresponding in position to one of the non-spring sections 344, which may be the lower non-spring section 344B as shown in FIG. 14, or the middle non-spring section 344C.

In the aforesaid ninth and tenth preferred embodiments as shown in FIGS. 15-18, the lower edge 412a of the upper guiding hole 412 and the upper edge 432a of the middle guiding hole 432 are arranged corresponding in position to the same non-spring section 344, and the upper edge 412b of the upper guiding hole 412 and the lower edge 432b of the middle guiding hole 432 are arranged corresponding in position to the other two non-spring sections 344, respectively. Besides, in FIGS. 17-18, the upper edge 422a of the lower guiding hole 422 and the lower edge 432b of the middle guiding hole 432 are arranged corresponding in position to the same non-spring section 344, and the lower edge 422b of the lower guiding hole 422 is arranged corresponding in position to the other non-spring section 344. In the aforesaid eighth and eleventh preferred embodiments as shown in FIGS. 14 and 19, the upper and lower edges 412b, 412a of the upper guiding hole 412 are arranged corresponding in position to the same non-spring section 344, i.e. the upper non-spring section 344A, and the upper and lower edges 432a, 432b of the middle guiding hole 432 are arranged corresponding in position to the same non-spring section 344, i.e. the middle non-spring section 344C.

According to the above contents, the probe seat in the present invention is provided with at least a passage for insertion of a spring probe therethrough. Each passage may be composed of a plurality of guiding holes, or composed of at least one guiding hole and at least one space. The guiding hole, which allows insertion of only one spring probe, is defined as the narrower part of the passage through which a spring probe is inserted. Besides, the inner wall of the guiding hole is close to the spring probe that is inserted through the guiding hole and the inner wall of the guiding hole might be in contact with the spring sleeve, thereby effectively limiting the position of the spring probe and supporting the spring probe. On the other hand, the space is defined as the wider part of the passage, and a plurality of spring probes can be inserted through the same space. Besides, the inner wall for defining the space is quite distanced from the spring probe and will not contact the spring probe.

As to the corresponding relationships between the junctures or guiding holes of the dies and the spring sections or non-spring sections of the spring sleeve mentioned in the present invention, although the figures only show that the aforesaid corresponding relationships are satisfied when the probe device of the present invention is not in probing, but they are also satisfied when the probe device of the present invention is in probing. Because the spring probe is moved in a very short distance between non-probing and probing statuses, the aforesaid corresponding relationships are satisfied no matter the probe device is not in probing or in probing. For example, when the probe device 27 is not in probing as shown in FIG. 14, the guiding holes 412, 432 of the probe seat 40 are in positions completely corresponding to the non-spring sections 344 of the spring sleeve 34. When the spring probe 30 of the probe device 27 moves from the non-probing status as shown in FIG. 14 to the probing status, the non-spring section 344 at the top of the spring sleeve 34 is remained stationary and the other spring sections are slightly moved upwards in a very short stroke, so that the guiding holes 412, 432 are still in positions completely corresponding to the non-spring sections 344, which means all of the upper and lower edges of the non-spring sections are not moved into the guiding holes. Further, taking the probe device 28 shown in FIGS. 15 and 16 for example, when it is not in probing as shown in FIGS. 15-16, the spring sections 342A, 342C of the spring sleeve 34 are located at positions completely corresponding to the guiding holes 412, 432 of the probe seat 40. When the spring probe 30 of the probe device 28 moves from the non-probing status as shown in FIGS. 15-16 to the probing status, the spring sections 342A, 342C are compressed and slightly moved upwards, but still completely located inside the guiding holes 412, 432, respectively. Besides, the amount of the elements of each die 41, 42, 43 is unlimited; each die 41, 42, 43 may be made integrally or composed of two or more elements. For example, the die 41 may be composed of two elements which are processed individually to become a part of the die 41 and then combined to become the die 41.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe device comprising:
 a spring probe including a needle, and a spring sleeve sleeved onto the needle and provided with at least one spring section and at least one non-spring section; and
 a probe seat including a plurality of dies stacked together, wherein a juncture of every two said dies connected with each other is aimed at one said non-spring section of the spring sleeve,
 wherein the plurality of dies comprise an upper die, a lower die, and at least one middle die between the upper die and the lower die, and
 wherein one said middle die has a guiding hole, in which one said spring section of the spring sleeve is completely received, and a notch communicated with the guiding hole, aimed at one said non-spring section that is connected with the one said spring section of the spring sleeve, and configured to avoid the one said spring section of the spring sleeve from being jammed at one said juncture when the one said spring section of the spring sleeve is compressed.

2. The probe device as claimed in claim 1, wherein the one said middle die further comprises a space communicating with the guiding hole of the one said middle die and corresponding in position to the one said non-spring section of the spring sleeve.

3. The probe device as claimed in claim 1, wherein the spring sleeve comprises a plurality of said spring sections.

4. The probe device as claimed in claim 3, wherein the one said middle die comprises a space communicating with the guiding hole of the one said middle die and corresponding in position to the one said non-spring section of the spring sleeve.

5. The probe device as claimed in claim 1, wherein a juncture of the upper die and the one said middle die is aimed at one said non-spring section; a juncture of the one said middle die and the lower die is aimed at another one said non-spring section; the upper die comprises an upper guiding hole; the at least one spring section of the spring sleeve comprises an upper spring section completely received in the upper guiding hole.

6. The probe device as claimed in claim 5, wherein the lower die comprises a lower guiding hole; the at least one spring section of the spring sleeve further comprises a lower spring section completely received in the lower guiding hole.

7. The probe device as claimed in claim 6, wherein the spring sleeve comprises a connection segment fixed to the needle and provided with a convex portion protruding over an outer cylinder surface of the at least one spring section and located in the lower guiding hole.

8. The probe device as claimed in claim 5, wherein the spring sleeve comprises a connection segment fixed to the needle and provided with a convex portion protruding over an outer cylinder surface of the at least one spring section; the lower die has a space in which the connection segment is located.

9. The probe device as claimed in claim 5, wherein the probe seat has a space located between the upper guiding hole and the guiding hole of the one said middle die.

10. The probe device as claimed in claim 5, wherein the lower die comprises a lower guiding hole; the at least one spring section of the spring sleeve further comprises a lower spring section completely received in the lower guiding hole; the probe seat comprises a space located between the guiding hole of the one said middle die and the lower guiding hole.

11. The probe device as claimed in claim 1, wherein the at least one non-spring section of the spring sleeve comprises an upper non-spring section, and a lower non-spring section fixed to the needle; the at least one spring section is located between the upper non-spring section and the lower non-spring section; the upper guiding hole is arranged corresponding in position to the upper non-spring section completely.

12. The probe device as claimed in claim 11, wherein the lower die comprises a space in which the lower non-spring section is located.

* * * * *